United States Patent
Kim et al.

(10) Patent No.: US 7,442,646 B2
(45) Date of Patent: Oct. 28, 2008

(54) SLURRY, CHEMICAL MECHANICAL POLISHING METHOD USING THE SLURRY, AND METHOD OF FORMING METAL WIRING USING THE SLURRY

(75) Inventors: Sung-Jun Kim, Suwon-si (KR);
Jeong-Heon Park, Suwon-si (KR);
Chang-Ki Hong, Seongnam-si (KR);
Jae-Dong Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 201 days.

(21) Appl. No.: 11/077,150

(22) Filed: Mar. 11, 2005

(65) Prior Publication Data
US 2006/0030155 A1    Feb. 9, 2006

(30) Foreign Application Priority Data
Aug. 3, 2004    (KR) ............... 10-2004-0061226

(51) Int. Cl.
*H01L 21/302*    (2006.01)
(52) U.S. Cl. ............... 438/691; 438/692; 51/307; 451/56
(58) Field of Classification Search .......... 438/689, 438/691, 692; 451/41, 60, 63, 56; 51/307
See application file for complete search history.

(56) References Cited

U.S. PATENT DOCUMENTS

| | | | |
|---|---|---|---|
| 5,118,540 A * | 6/1992 | Hutchison | 428/40.7 |
| 6,214,098 B1 * | 4/2001 | Lee | 106/3 |
| 6,302,765 B1 * | 10/2001 | Jacquinot et al. | 451/41 |
| 6,312,486 B1 * | 11/2001 | Sandhu et al. | 51/307 |
| 6,530,968 B2 * | 3/2003 | Tsuchiya et al. | 51/307 |
| 6,561,883 B1 * | 5/2003 | Kondo et al. | 451/63 |
| 6,803,353 B2 * | 10/2004 | Martyak et al. | 510/175 |
| 2002/0028580 A1 | 3/2002 | Nojo et al. | |
| 2002/0059755 A1 | 5/2002 | Kido et al. | |
| 2002/0062600 A1 | 5/2002 | Mandigo et al. | |
| 2003/0119319 A1 | 6/2003 | Sinha et al. | |
| 2003/0124861 A1 * | 7/2003 | Kwon et al. | 438/692 |
| 2003/0148616 A1 * | 8/2003 | Lee et al. | 438/692 |
| 2003/0173329 A1 | 9/2003 | Matsui et al. | |
| 2004/0033764 A1 * | 2/2004 | Lee et al. | 451/36 |

FOREIGN PATENT DOCUMENTS

JP    10049124    2/1998

(Continued)

OTHER PUBLICATIONS

Korean Office Action issued: Jan. 31, 2006 w/English Translation.

*Primary Examiner*—Andy Huynh
(74) *Attorney, Agent, or Firm*—Harness, Dickey & Pierce, P.L.C.

(57) ABSTRACT

A slurry, chemical mechanical polishing (CMP) method using the slurry, and method of forming metal wiring using the slurry. The slurry may include a polishing agent, an oxidant, and at least one defect inhibitor to protect the metal film. The CMP method and method of forming metal wiring may employ one or two slurries with at least one of the slurries including at least one defect inhibitor.

19 Claims, 14 Drawing Sheets

FOREIGN PATENT DOCUMENTS

| | | |
|---|---|---|
| JP | 2000-049124 | 2/2000 |
| JP | 2000-150435 | 5/2000 |
| JP | 2000-252250 | 9/2000 |
| JP | 2004-172606 | 6/2004 |
| KR | 1020010036274 A | 5/2001 |
| KR | 1020010109960 | 12/2001 |
| KR | 2002-15698 | 2/2002 |
| KR | 2002-0026877 | 4/2002 |
| KR | 2003-0013146 | 2/2003 |
| KR | 1020040000237 | 1/2004 |
| KR | 1020040016154 A | 2/2004 |
| KR | 1020040041041 | 5/2004 |
| KR | 10-2004-0050564 | 6/2004 |
| KR | 1020050034381 | 4/2005 |
| WO | 01/80296 A1 | 10/2001 |

* cited by examiner

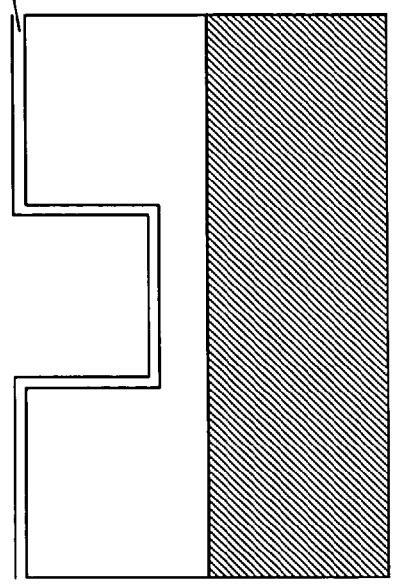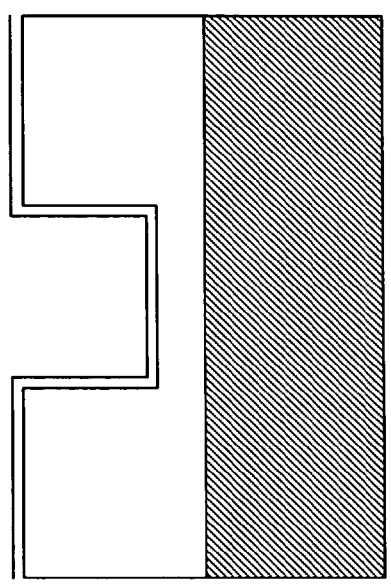

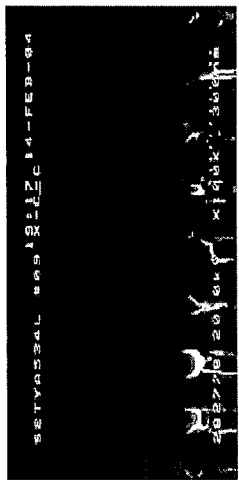
Fig. 12A Conventional CMP slurry
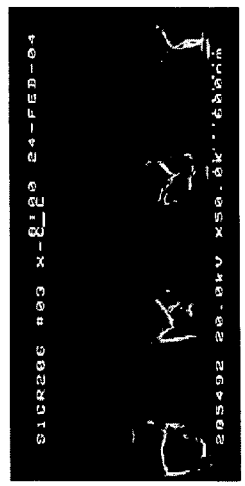
Fig. 12B Example CMP slurry of the present invention
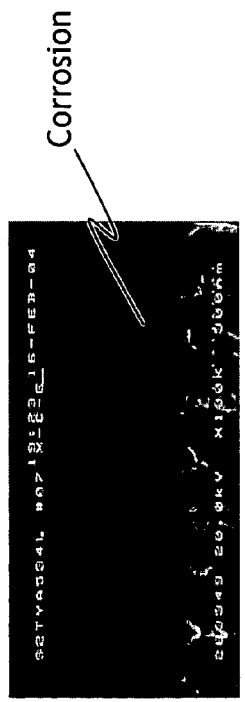
Fig. 13A Conventional CMP slurry
Fig. 13B Example CMP slurry of the present invention

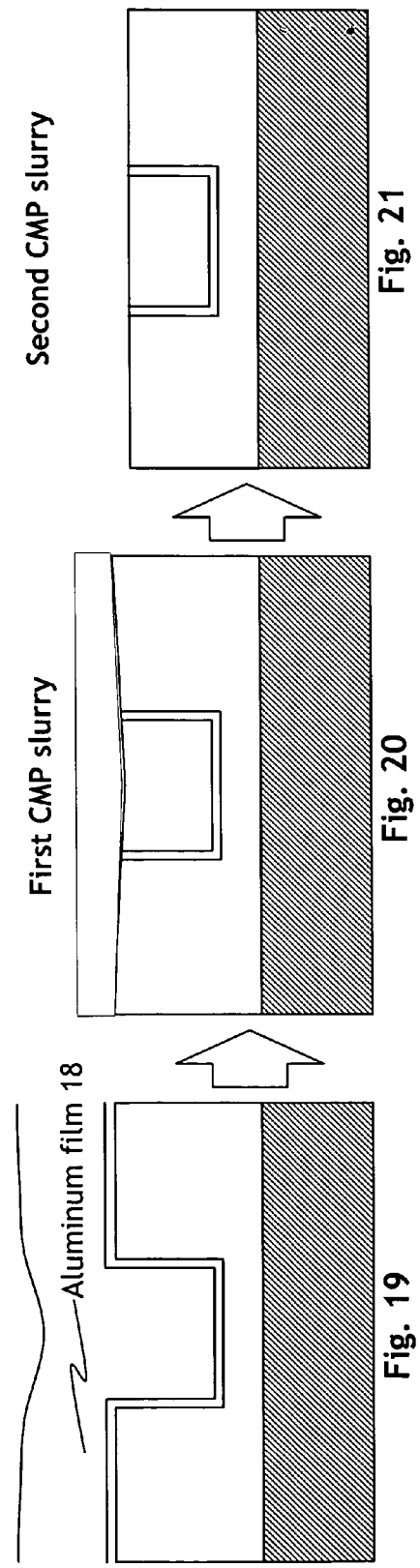

US 7,442,646 B2

SLURRY, CHEMICAL MECHANICAL POLISHING METHOD USING THE SLURRY, AND METHOD OF FORMING METAL WIRING USING THE SLURRY

PRIORITY STATEMENT

This application claims the benefit under 35 U.S.C. § 119 (a) of Korean Patent Application No. 2004-0061226 filed on Aug. 3, 2004, the contents of which are hereby incorporated by reference in their entirety.

BACKGROUND OF THE INVENTION

Aluminum which includes aluminum alloys is one of the conductive materials used for forming wiring or a plug for semiconductor devices. An aluminum alloy may be defined as any composition where aluminum is the main component.

Conventionally, an aluminum film may be deposited using a sputtering method or a CVD method, and an aluminum pattern may be formed by etching the aluminum film using a reactive ion etch (RIE) method. Drawbacks of the conventional RIE method may include bridge problems and/or voids in the aluminum wiring patterns due to heat stress.

Recently, a damascene process has been widely used for forming aluminum wiring. A conventional damascene process is a process in which interconnect metal lines may be delineated in dielectrics isolating the interconnect metal lines from each other by chemical mechanical planarization or chemical mechanical polishing (CMP). In a conventional damascene process, an interconnect pattern may be lithographically defined in a layer of dielectric, metal is deposited to fill resulting trenches, and excess metal is removed by CMP. A conventional damascene process for forming metal wiring, such as aluminum wiring or copper wiring, is shown in FIGS. 1-5.

As shown in FIG. 1, a conventional damascene process may include depositing an inter metal dielectric layer (IMD) 12 on a substrate 10 and defining a region 14 for forming a metal wiring by patterning the IMD 12, as shown in FIG. 2.

As shown in FIG. 3, a conventional damascene process may further include forming a barrier metal layer 16, depositing a thick aluminum film 18 on the barrier metal layer 16, as shown in FIG. 4, and removing the aluminum film 18 and the barrier metal layer 16 on an upper surface of the IMD 12 using a CMP process, as shown in FIG. 5.

In the conventional damascene process for forming aluminum wiring as described above, the CMP process may affect one or more electrical characteristics of the aluminum wiring. More particularly, a removal rate selectivity of the CMP slurry may be a factor that may affect an electrical characteristic of the aluminum wiring.

When the removal rate selectivity of an aluminum film to a silicon oxide film, such as the aluminium film 16 to the Inter Metal Dielectric (IMD) layer 12 of FIGS. 1-5, is low, the aluminum film 16 can be overetched during the CMP process. Overetching may result in a damascene of a surface area of the aluminum wiring, which may increase an electrical resistance of the aluminum wiring. Accordingly, the speed of a signal transferred via the aluminum wiring of a semiconductor device may become slower, and eventually overall performance of the semiconductor device may be degraded.

As set forth above, low removal rate selectivity of a metal film, such as an aluminum film to a silicon oxide film may cause overetching of the aluminum film, decrease a surface area of the aluminum wiring, increase an electrical resistance of the aluminum wiring, reduce the speed a signal transferred via the aluminum wiring of a semiconductor device, and/or degrade the an overall performance of the semiconductor device.

Conversely, a high removal rate selectivity of metal film to silicon oxide film may cause defects such as scratches, corrosion, and/or pitting. A scratch defect, shown in FIG. 6, is a surface roughness which may result from damage caused by a polishing agent on a surface of the aluminum film. A pitting defect, shown in FIG. 7, on the surface of the aluminum film can occur when a scratch defect is more severe. A corrosion defect, shown in FIG. 8, may occur when aluminum ions break away from the aluminum film due to a chemical reaction with other materials.

The above-described defects may be caused by the soft characteristics of the metal, for example, aluminium, which has a relatively low hardness and resistance to stress. Scratches, corrosions, or pits on an aluminum film may not only reduce a reflective index of the metal, but may also decrease a reliability of the metal wiring, which in a worst case may lead to a disconnection in the metal wiring.

SUMMARY OF THE INVENTION

Example embodiments of the present invention are directed to a slurry for a chemical mechanical polishing (CMP) method for polishing a metal film, such as an aluminum film, which provides a high removal rate selectivity of metal film to another film, such as a silicon oxide film, a CMP method using the slurry, and a method of forming an aluminum wiring using the CMP method.

Example embodiments of the present invention are directed to a CMP slurry for an aluminum film, which can reduce or prevent scratches, pitting, corrosion, and/or defects on a surface of a metal film, such as an aluminium film, a CMP method using the slurry, and a method of forming an aluminum wiring using the CMP method.

Example embodiments of the present invention are directed to a CMP slurry for an aluminum film, which can reduce or prevent dishing and/or erosion defects on a surface of a metal film, such as an aluminium film, a CMP method using the slurry, and a method of forming an aluminum wiring using the CMP method.

Example embodiments of the present invention are directed to a high removal rate selectivity of a metal film, such as an aluminium film, to another film, such as silicon oxide film, reducing or preventing a surface of the metal layer from scratches, pits, and/or corrosion defects and/or reducing or preventing a surface of the metal layer from dishing and/or erosion defects.

Example embodiments of the present invention are directed to slurries, chemical mechanical polishing (CMP) methods using the slurries, and method of forming metal wiring using the slurries. In an example embodiment, the slurry may include a polishing agent, an oxidant, and at least one defect inhibitor to protect the metal film. In an example embodiment, the CMP methods and method of forming metal wiring may employ one or two slurries with at least one of the slurries including at least one defect inhibitor.

In an example embodiment, the present invention is directed to a slurry may include a polishing agent, an oxidant, and at least one defect inhibitor to protect the metal film.

In an example embodiment, the present invention is directed to a chemical mechanical polishing (CMP) method for a metal film formed on a semiconductor substrate, the method including preparing a slurry including a polishing agent, an oxidant, and at least one defect inhibitor to protect the metal film, and performing chemical mechanical polishing (CMP) of the metal film using the slurry.

In an example embodiment, the present invention is directed to a chemical mechanical polishing (CMP) method for a metal film formed on a semiconductor substrate, the method including preparing a first slurry including a polishing agent and an oxidant, performing chemical mechanical polishing (CMP) of the metal film using the first slurry, preparing a second slurry including a polishing agent, an oxidant, and at least one defect inhibitor to protect the metal film, and performing chemical mechanical polishing (CMP) of the metal film using the second slurry.

In an example embodiment, the present invention is directed to a method for forming a metal wiring including forming an inter metal dielectric layer on a semiconductor substrate, patterning the inter metal dielectric layer to define a region for the wiring, forming a barrier metal layer on the patterned inter metal dielectric layer, forming a metal film by depositing a metal on the barrier metal layer, and polishing the metal film using a slurry including a polishing agent, an oxidant, and at least one defect inhibitor to protect the metal film to form the metal wiring.

In an example embodiment, the present invention is directed to a method for forming a metal wiring including forming an inter metal dielectric layer on a semiconductor substrate, patterning the inter metal dielectric layer to define a region for the wiring, forming a barrier metal layer on the patterned inter metal dielectric layer, forming a metal film by depositing a metal on the barrier metal layer, polishing the metal film using a first slurry including a polishing agent and an oxidant, and polishing the metal film using a second slurry including a polishing agent, an oxidant, and at least one defect inhibitor to protect the metal film to form the metal wiring.

BRIEF DESCRIPTION OF THE DRAWINGS

The present invention will become more fully understood from the detailed description given below and the accompanying drawings, which are given for purposes of illustration only, and thus do not limit the invention.

FIGS. 1-5 illustrate a conventional damascene process.

FIGS. 12A and 12B illustrate an aluminum surface of a first device after CMP using a conventional slurry and a slurry in accordance with an example embodiment of the present invention, respectively.

FIGS. 13A and 13B illustrate an aluminum surface of a first device after CMP using a conventional slurry and a slurry in accordance with an example embodiment of the present invention, respectively.

FIGS. 19-21 illustrate the formation of a metal film, such as an aluminum film by polishing with two CMP slurries in accordance with example embodiments of the present invention

It should be noted that these Figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

DETAILED DESCRIPTION OF EXAMPLE EMBODIMENTS OF THE PRESENT INVENTION

Example embodiments of the present invention provide a slurry composition for use in a CMP process and/or a method of forming metal wiring, having a high removal rate selectivity, the slurry composition including a compound providing a protective layer-forming function to a metal layer, such as an aluminum layer, by adsorbing onto the surface of the metal layer, thereby reducing or preventing the formation of defects on the surface of the metal, such as scratches, pits, corrosion, dishing and/or erosion.

The compound may provide the protective layer-forming function to the metal layer by generating anions with a negative charge (−) that adsorb onto the surface of the metal layer having cations with a positive (+) charge to form a protective layer. The compound may also generate cations, for example $H^+$ ions, that increase the acidity the CMP slurry solution.

The adsorbility of the compound to the metal layer in a CMP slurry solution may increase as pH decreases because the zeta potential between the metal layer and the CMP slurry solution increases as the pH decreases.

Figure 1:
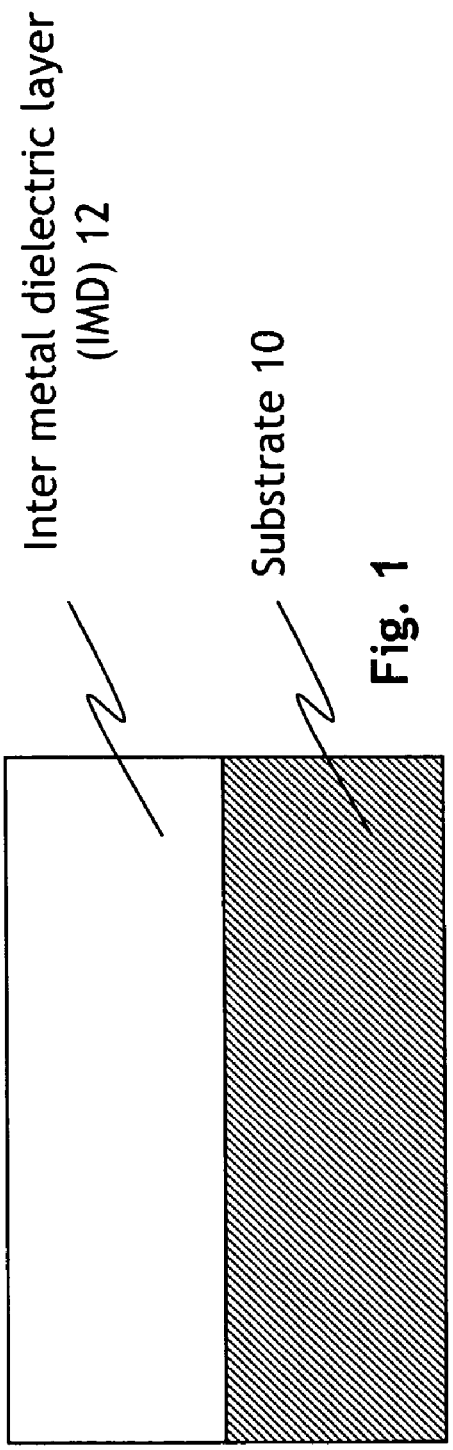
Figure 2:
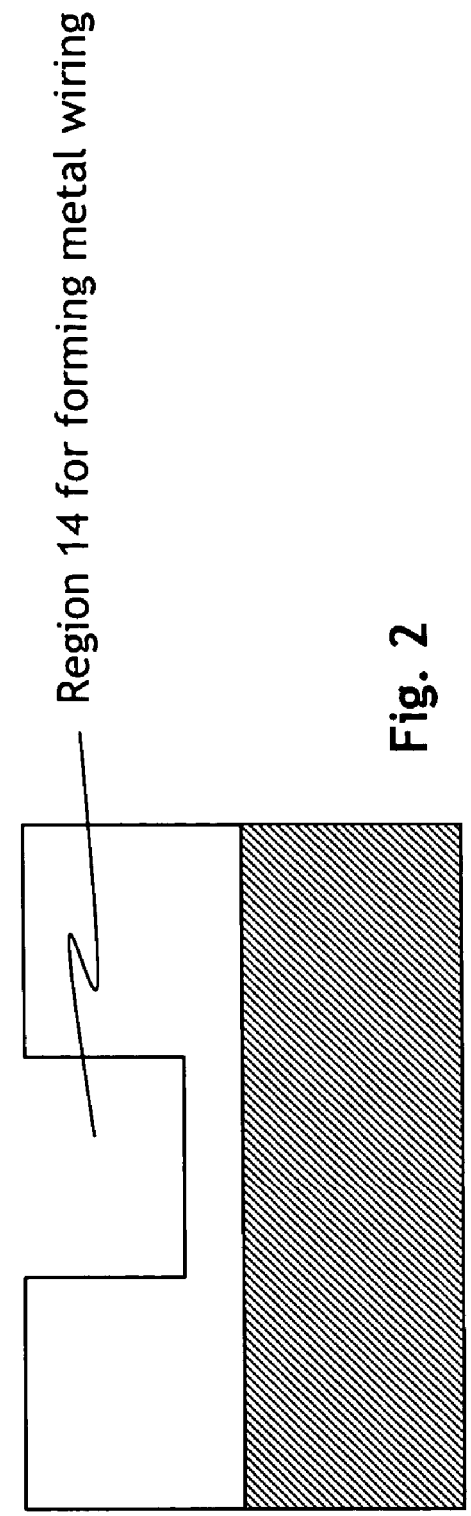
Figure 5:
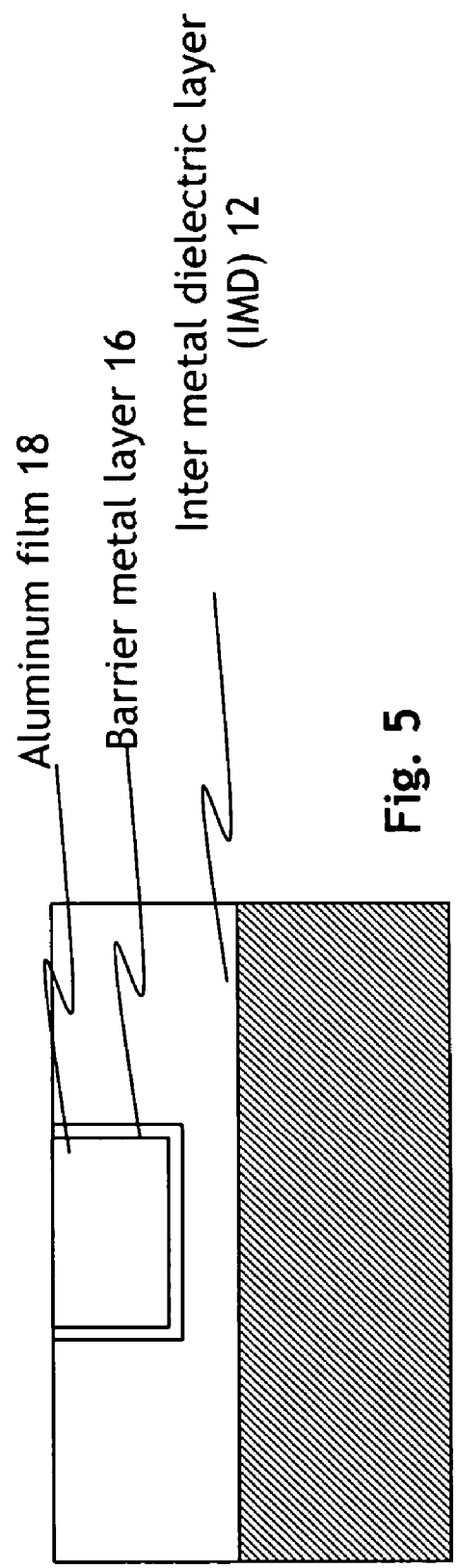
Figure 6:
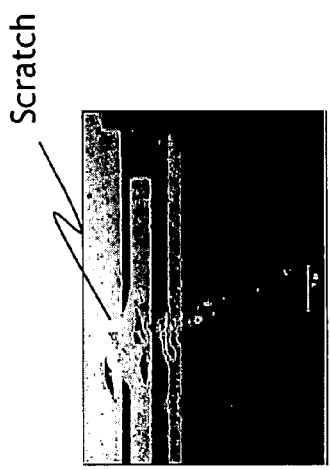
FIG. 6 illustrates scratches on an aluminum film polished by a conventional slurry with a high removal rate selectivity of aluminum film to silicon oxide.
Figure 7:
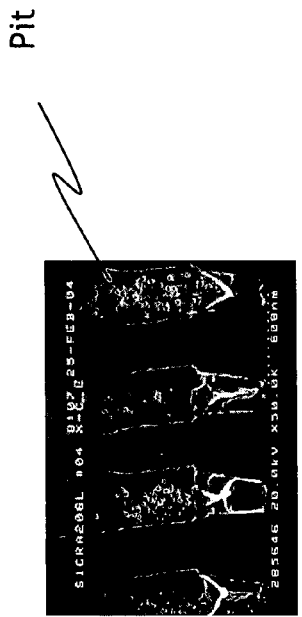
FIG. 7 illustrates pitting on an aluminum film polished by a conventional slurry with a high removal rate selectivity of aluminum film to silicon oxide.
Figure 8:
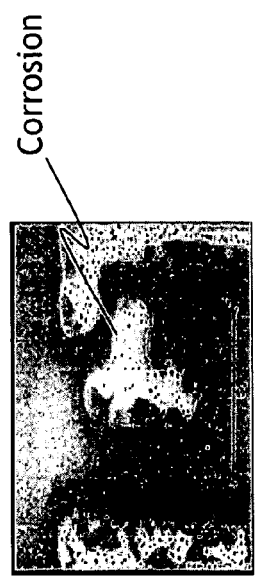
FIG. 8 illustrates corrosion on an aluminum film polished by a conventional slurry with a high removal rate selectivity of aluminum film to silicon oxide.
Figure 9:
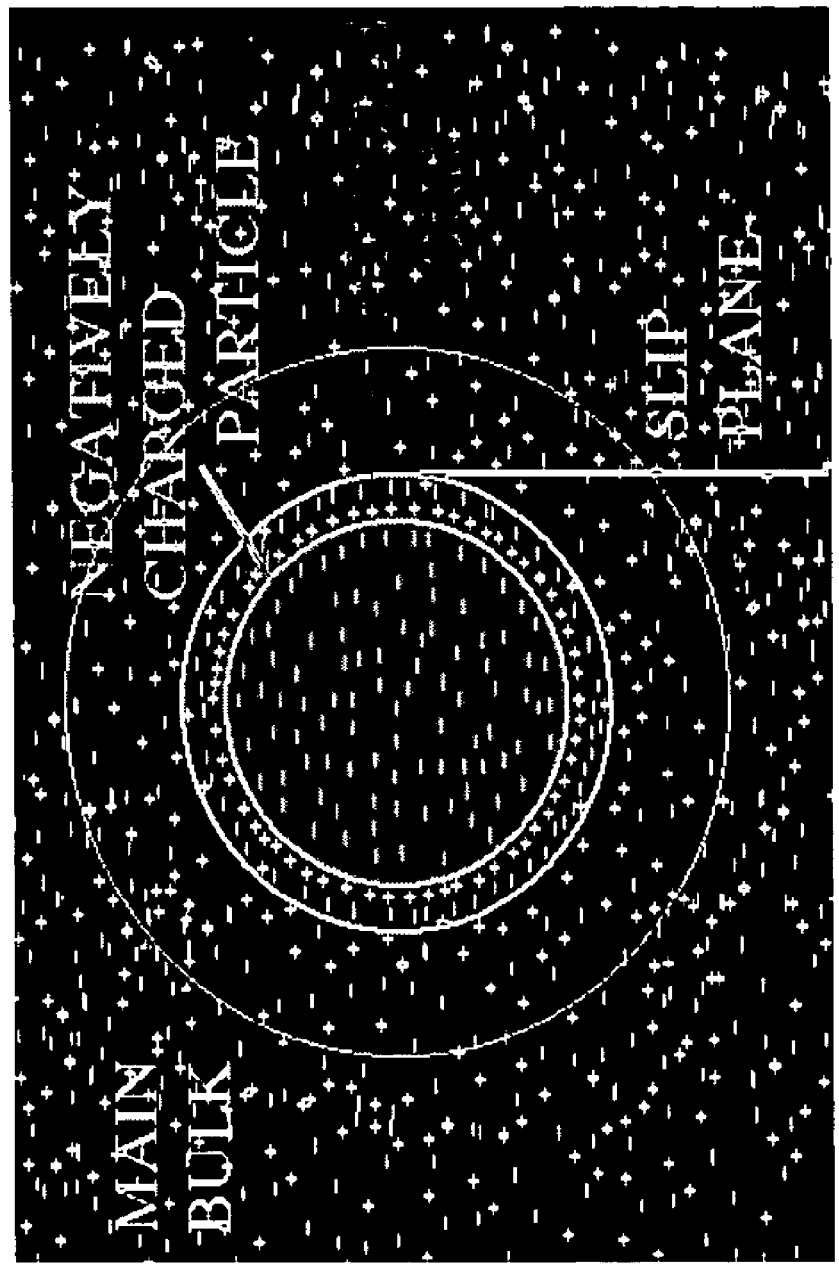
FIG. 9 illustrates the zeta potential of an example, negatively charged particle.

FIG. 9 illustrates the zeta potential of an example, negatively charged particle. The negatively charged particle has a surface with a negative charge. In the solution (for example, water) near the particle, is a first layer of mostly positive ions and then a second layer of mostly negative ions. The first and second layers are immobile ions. As the distance from the particle increases further, the mixture of positive and negative ions approaches the mixture of positive and negative ions in the bulk fluid. As shown in FIG. 9, the outer circle is about where the mixture of positive and negative ions is equally distributed.

Movement of the ions in the two shells at the surface of the particle (the Helmholtz double layer) is greatly restricted. They accompany the particle and dissipate some of its charge. After these two shells, there exists a "slip plane". The zeta potential is the difference in charge between the bulk fluid and the particle with its held, attracted ions. Zeta potential is dependent upon the ionic concentration, pH, viscosity, and dielectric constant of the solution being analyzed.

Figure 10:
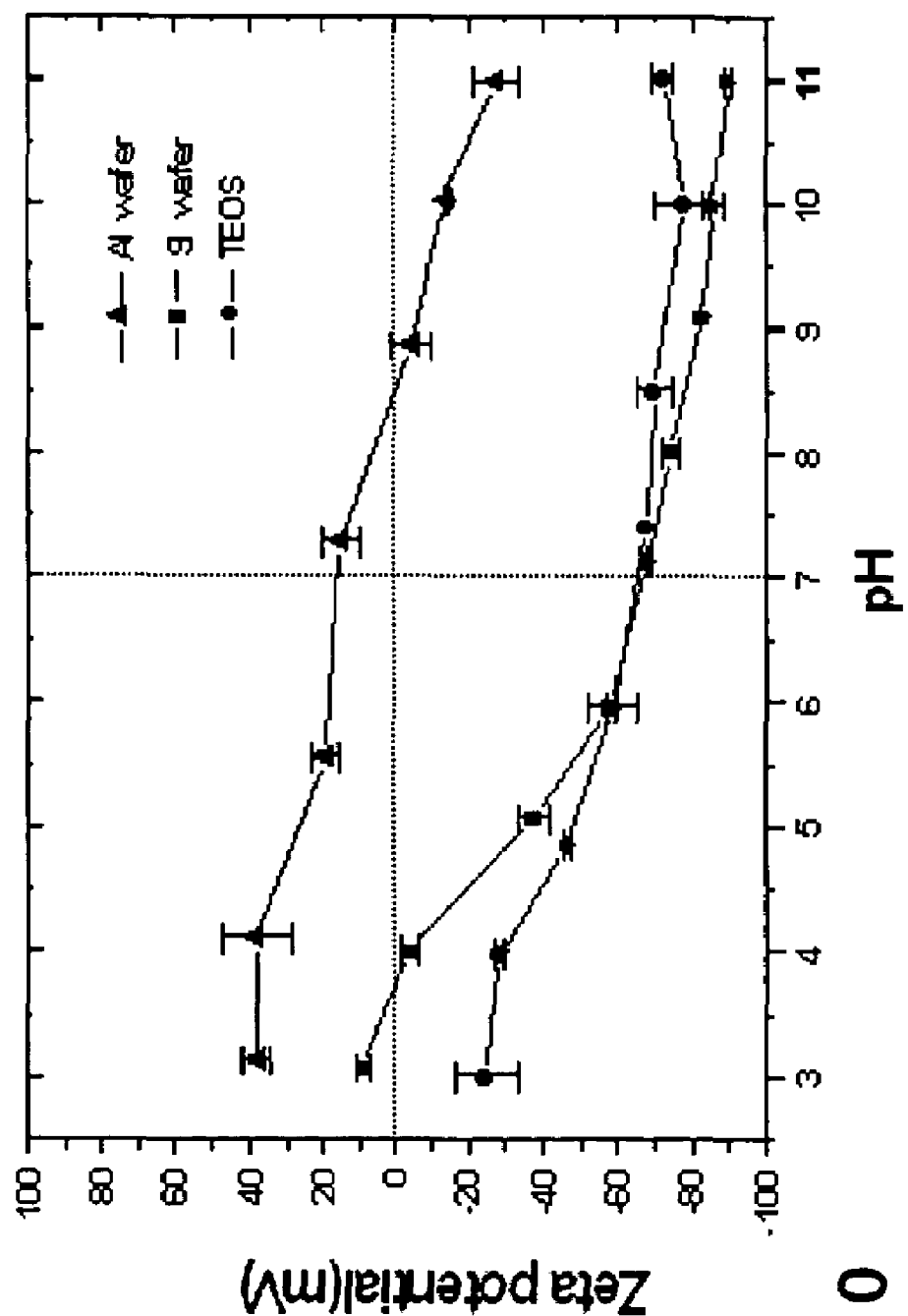
FIG. 10 illustrates zeta potential as a function of pH for an aluminium wafer, a silicon wafer, and a tetraethyl orthosilicate (TEOS) wafer.

FIG. 10 illustrates zeta potential as a function of pH for an aluminium wafer, a silicon wafer, and a tetraethyl orthosilicate (TEOS) wafer.

Figure 11:
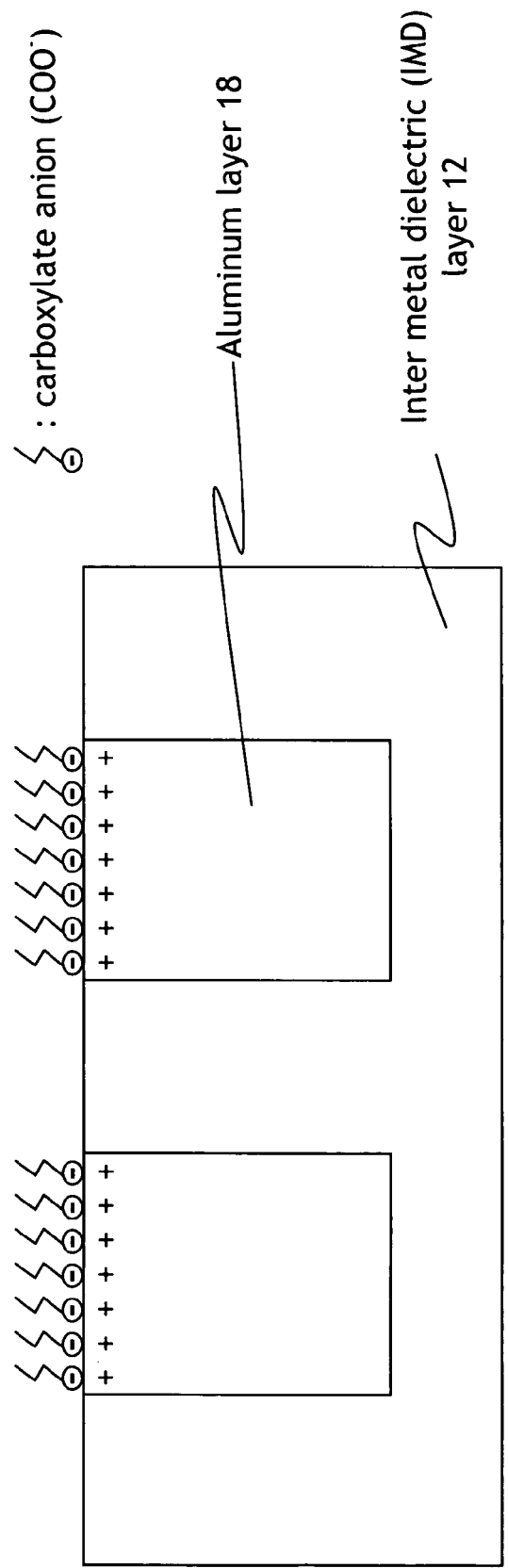
FIG. 11 illustrates the dissociation of a polymeric compound may in into anions to form a passivation layer by adsorbing onto the surface of the metal layer and cations to acidify a CMP slurry solution.

Polymeric compounds having a carboxyl group are suitable compounds that can generate anions which adsorb onto the surface of a metal layer and hydrogen ions, which acidify the CMP slurry solution. As shown in FIG. 11, a polymeric compound may dissociate in the CMP slurry solution into carboxylate anions ($COO^-$) to form a passivation layer by adsorbing onto the surface of the aluminum layer 18 and hydrogen ions ($H^+$) to acidify the CMP slurry solution.

In an example embodiment, the slurry includes an abrasive, an oxidizer, a pH controller, and/or one or more defect inhibitors. In an example embodiment, the abrasive may be a silica, such as colloidal silica and/or fumed silica, from 0.5 to 20 weight % (inclusive).

In an example embodiment, the oxidizer may be hydrogen peroxide ($H_2O_2$) and/or ammonium persulfate $(NH4)_2S_2O_8$, from 0.5 to 5 weight % (inclusive).

In an example embodiment, the pH controller is one or more of $H_3PO_4$, $HNO_3$, and $H_2SO_4$. In an example embodiment, the pH is in the acid region because the zeta potential is positive in the acid region. In an example embodiment, the pH is less than 7. In an example embodiment, the pH is 2-4 (inclusive).

In an example embodiment, one of the defect inhibitors may be a polymeric compound having carboxyl group. Examples include poly acrylic acid (PAA), poly acrylic acid co maleic acid (PAMA), salts thereof, and mixtures thereof. In an example embodiment, another of the defect inhibitors may include a chelating agent, from 0.01 to 20 weight % (inclusive). Examples include ethylene diaminetetraacetic acid (EDTA), nitrilotriacetic acid (NTA), diethylenetriamine-pentaacetic acid (DTPA), hydroxyethyl ethylene diaminetri-acetic acid (HEDTA), methylglycinediacetic acid (MGDA), salts thereof, and mixtures thereof.

In an example embodiment, one of the defect inhibitors may form a protective layer on the metal film. In an example embodiment, one of the defect inhibitors may adsorb onto a surface of the metal film. In an example embodiment, one of the defect inhibitors may include a polymeric compound further including a carboxyl group. In an example embodiment, one of the defect inhibitors may include a co-polymer further including acrylic acid.

In an example embodiment, a content of one of the defect inhibitors may be in a range of 0.01-20 weight % (inclusive) of a total weight of the slurry. In an example embodiment, a content of one of the defect inhibitors may be in a range of 0.01-10 weight % (inclusive) of a total weight of the slurry. In an example embodiment, a content of one of the defect inhibitors may be in a range of 10-20 weight % (inclusive) of a total weight of the slurry. In an example embodiment, a content of one of the defect inhibitors may be in a range of 0.01-5 weight % (inclusive) of a total weight of the slurry. In an example embodiment, a content of one of the defect inhibitors may be in a range of 5-10 weight % (inclusive) of a total weight of the slurry. In an example embodiment, a content of one of the defect inhibitors may be in a range of 10-15 weight % (inclusive) of a total weight of the slurry. In an example embodiment, a content of one of the defect inhibitors may be in a range of 15-20 weight % (inclusive) of a total weight of the slurry. In an example embodiment, a content of one of the defect inhibitors may be in a range of 0.01-3 weight % (inclusive) of a total weight of the slurry. In an example embodiment, a content of one of the defect inhibitors may be in a range of 0.01-1 weight % (inclusive) of a total weight of the slurry. In an example embodiment, a content of one of the defect inhibitors may be in a range of 0.01-0.5 weight % (inclusive) of a total weight of the slurry. In an example embodiment, a content of one of the defect inhibitors may be in a range of 0.01-0.1 weight % (inclusive) of a total weight of the slurry. In an example embodiment, a content of one of the defect inhibitors may be in a range of 0.01-0.05 weight % (inclusive) of a total weight of the slurry. In an example embodiment, a content of one of the defect inhibitors may be in a range of 0.1-0.5 weight % (inclusive) of a total weight of the slurry. In an example embodiment, a content of one of the defect inhibitors may be in a range of 0.2-0.3 weight % (inclusive) of a total weight of the slurry.

In an example embodiment, one of the defect inhibitors may include at least one material selected from the group consisting of PAA, PAMA, salts thereof, and mixtures thereof. In an example embodiment, one of the defect inhibitors may include a PAA salt or a PAMA salt. In an example embodiment, one of the defect inhibitors may include PAA or PAMA. In an example embodiment, one of the defect inhibitors may lower a pH of the slurry. In an example embodiment, one of the defect inhibitors may include H+ ions. In an example embodiment, one of the defect inhibitors reduces at least one of scratching, corrosion, pitting, dishing, and/or erosion.

In an example embodiment, another of the defect inhibitors may be a chelating agent. In an example embodiment, a content of the chelating agent may be in a range of 0.01-20 weight % (inclusive) of a total weight of the slurry. In an example embodiment, a content of the chelating agent may be in a range of 0.01-10 weight % (inclusive) of a total weight of the slurry. In an example embodiment, a content of the chelating agent may be in a range of 10-20 weight % (inclusive) of a total weight of the slurry. In an example embodiment, a content of the chelating agent may be in a range of 0.01-5 weight % (inclusive) of a total weight of the slurry. In an example embodiment, a content of the chelating agent may be in a range of 5-10 weight % (inclusive) of a total weight of the slurry. In an example embodiment, a content of the chelating agent may be in a range of 10-15 weight % (inclusive) of a total weight of the slurry. In an example embodiment, a content of the chelating agent may be in a range of 15-20 weight % (inclusive) of a total weight of the slurry. In an example embodiment, a content of the chelating agent may be in a range of 0.01-3 weight % (inclusive) of a total weight of the slurry. In an example embodiment, a content of the chelating agent may be in a range of 0.01-1 weight % (inclusive) of a total weight of the slurry. In an example embodiment, a content of the chelating agent may be in a range of 0.01-0.5 weight % (inclusive) of a total weight of the slurry. In an example embodiment, a content of the chelating agent may be in a range of 0.01-0.3 weight % (inclusive) of a total weight of the slurry. In an example embodiment, a content of the chelating agent may be in a range of 0.01-0.2 weight % (inclusive) of a total weight of the slurry. In an example embodiment, a content of the chelating agent may be in a range of 0.05-0.15 weight % (inclusive) of a total weight of the slurry. In an example embodiment, a content of the chelating agent may be in a range of 0.2-0.3 weight % (inclusive) of a total weight of the slurry.

In an example embodiment, the chelating agent may include at least one material selected from the group consisting of EDTA, NTA, DTPA, HEDTA, MGDA, salts thereof, and mixtures thereof. In an example embodiment, another of the defect inhibitors reduces at least one of scratching, corrosion, pitting, dishing, and/or erosion.

In an example embodiment, a content of the abrasive (or polishing agent) may be in a range of 0.5-20 weight % (inclusive) of a total weight of the slurry. In an example embodiment, the abrasive (or polishing agent) may include at least one material selected from the group consisting of colloidal silica and fumed silica.

In an example embodiment, a content of the oxidizer (or oxidant) may be in a range of 0.5-5 weight % (inclusive) of a total weight of the slurry. In an example embodiment, the oxidizer (or oxidant) may include at least one material selected from the group consisting of hydrogen peroxide and ammonium persulfate.

In an example embodiment, the pH controller controls a pH of the slurry. In an example embodiment, the pH controller may include at least one material selected from the group consisting of $H_3PO_4$, $HNO_3$, and $H_2SO_4$. In an example embodiment, the pH controller lowers the pH of the slurry and raises a zeta potential of the metal film between the metal film and the slurry.

In an example embodiment, the metal film is an aluminum or aluminum alloy film or a copper or copper alloy film. In an example embodiment, the metal film may be used to form a wiring or a plug.

To test the effect of the defect inhibitor having a carboxyl group, a slurry in accordance with an example embodiment of the present invention including 10 weight % colloidal silica, 1 weight % hydrogen peroxide, 0.1 weight % EDTA and 0.25 weight % PAMA (a defect inhibitor including the carboxyl group) and a conventional CMP slurry including 10 weight % colloidal silica, 1 weight % hydrogen peroxide, 0.1 weight % EDTA and 0.25 weight % polyethylene imine (PEI) were selectively used in an aluminum CMP process. The results are shown in FIGS. 12A and 12B for a metal line of a first device (FN73) and in FIGS. 13A and 13B for a metal line of a second device (L13).

To test the effect of defect inhibitor including a chelating agent, a conventional CMP slurry including 10 weight % colloidal silica, 1 weight % hydrogen peroxide, 0.25 weight % PEI and 0.1 weight % EDTA, a slurry in accordance with an example embodiment of the present invention including 10 weight % colloidal silica, 1 weight % hydrogen peroxide and 0.25 weight % PAMA and another slurry in accordance with an example embodiment of the present invention including 10 weight % colloidal silica, 1 weight % hydrogen peroxide, 0.25 weight % PAMA, and 0.1 weight % EDTA were selectively used in an aluminum CMP process. The results are shown in FIGS. 14, 15, and 16, respectively.

Figure 16:
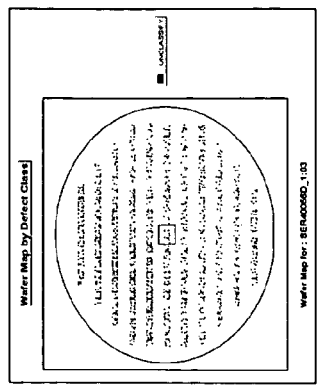
FIGS. 14-16 illustrate the formation of a metal film using one conventional slurry and two slurries in accordance with example embodiments of the present invention, respectively.
Figure 15:
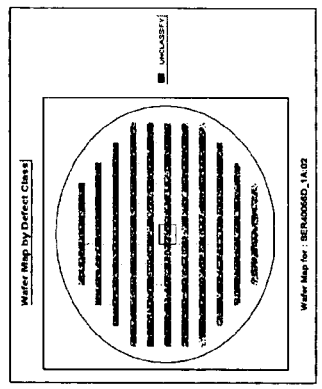
Figure 14:
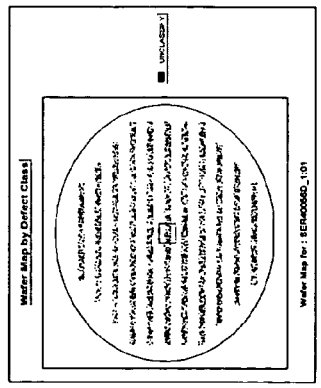

Tests represented by FIGS. 14, 15, and 16 demonstrate a CMP slurry including PAMA only as a defect inhibitor may result in fewer defects overall than a conventional CMP slurry including PEI and EDTA, but possibly more scratch defects. A CMP slurry including PAMA and EDTA may further reduce scratch defects. As a result, defects created in a metal surface by CMP polishing may be further reduced by using a slurry that includes a first defect inhibitor, such as PAMA, and a second defect inhibitor, such as EDTA.

Example embodiments of the present invention reduce or prevent the formation of defects on a surface of a metal layer, such as scratches, pits, corrosion, dishing and/or erosion by forming a protective layer and/or decreasing the removal rate of the metal layer.

Figure 17:
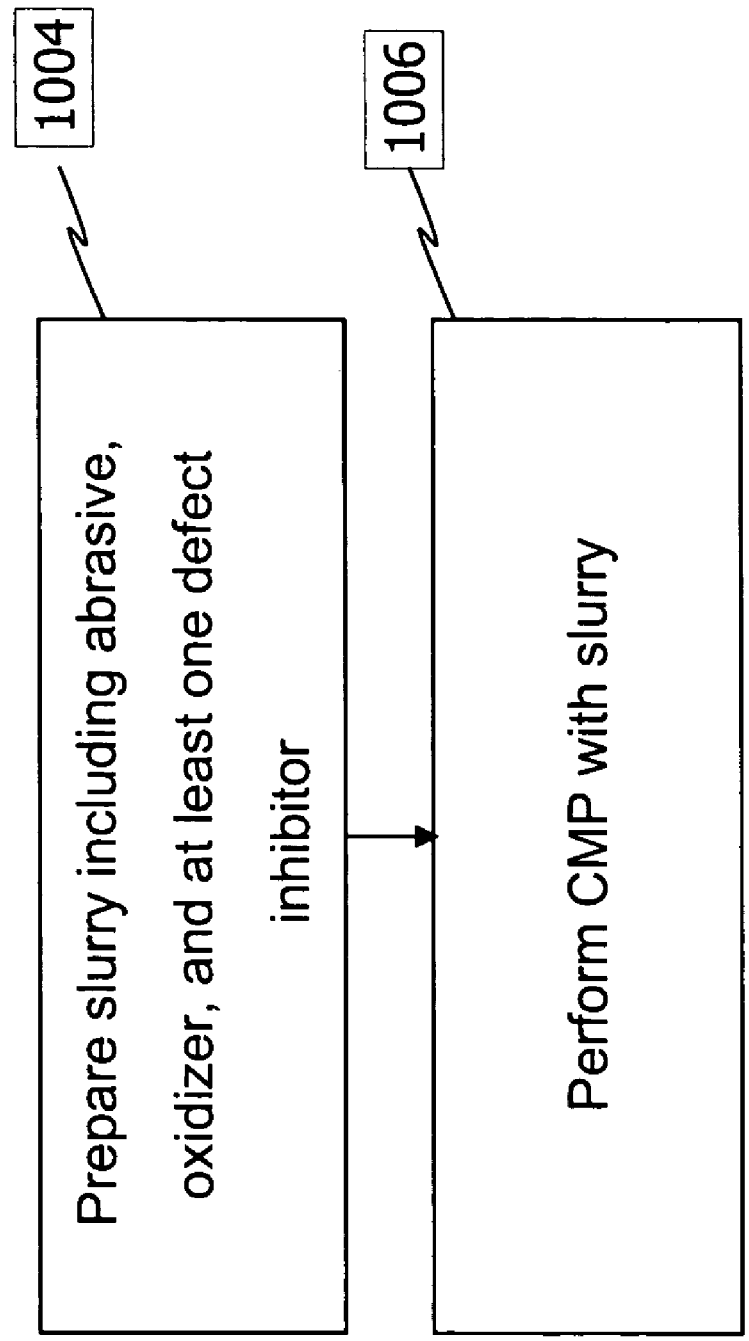
FIG. 17 illustrates an example method of performing CMP in accordance with the present invention using a slurry including an abrasive, an oxidizer, and at least one defect inhibitor.

In an example embodiment, a CMP slurry according to the present invention may be usually used to polish the surface of a metal layer so that metal wiring is maintained at the damascene pattern, thus exposing the surface of an inter metal dielectric layer. As shown in FIG. 17, an example method of performing CMP in accordance with the present invention may include preparing a slurry as described above including an abrasive, an oxidizer, and at least one defect inhibitor at 1004 and performing CMP with the slurry at 1006.

In an example embodiment, the removal rate selectivity of the slurry is 20-1:1. In another example embodiment, the removal rate selectivity of the slurry is 17-1.5:1.

Figure 18:
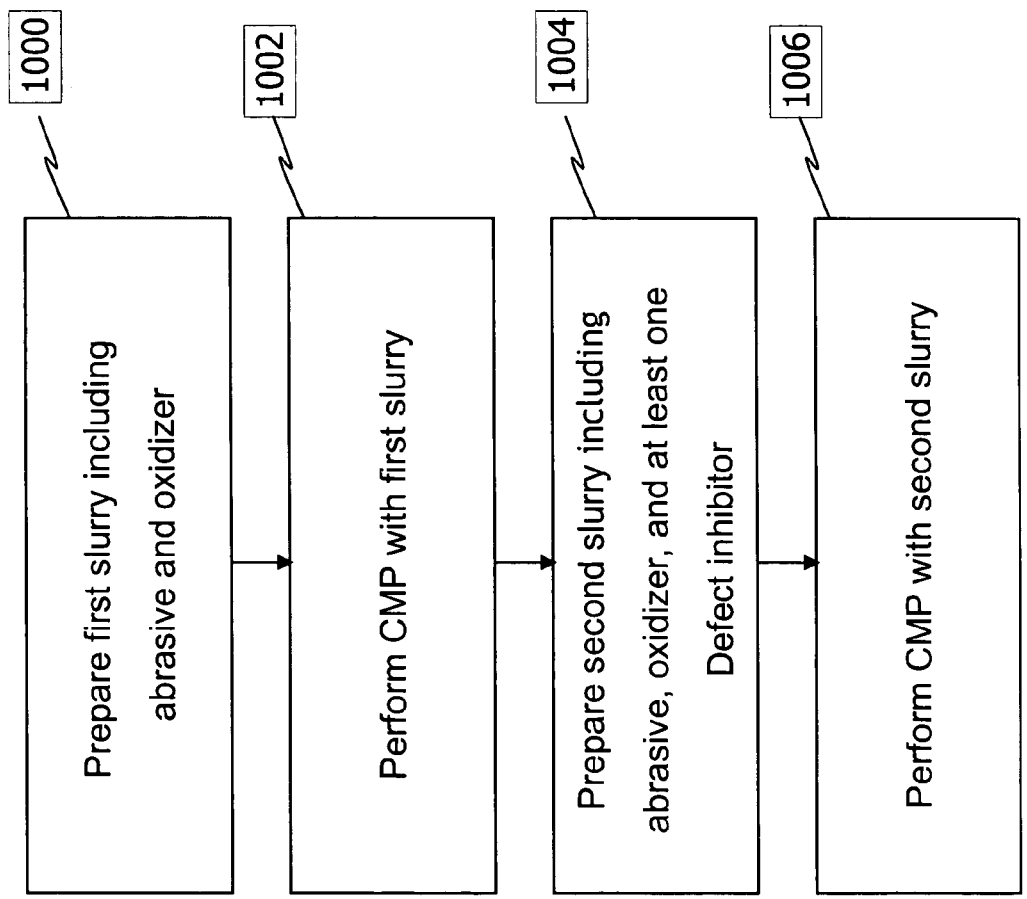
FIG. 18 illustrates another example method of performing CMP in accordance with the present invention using a first slurry including an abrasive and an oxidizer and a second slurry including an abrasive, an oxidizer, and at least one defect inhibitor.

In another example embodiment, a CMP slurry according to the present invention may be usually used as a second CMP slurry to polish the surface of a metal layer after a first CMP is performed so that the metal wiring is maintained at the damascene pattern, thus exposing the surface of the inter metal dielectric layer. As shown in FIG. 18, an example method of performing CMP in accordance with the present invention may include preparing a first slurry including an abrasive and an oxidizer at 1000, performing CMP with the first slurry at 1002, preparing a second slurry as described above including an abrasive, an oxidizer, and at least one defect inhibitor at 1004 and performing CMP with the second slurry at 1006.

In an example embodiment, the removal rate selectivity of the first slurry is greater than removal rate selectivity of the second slurry. In another example embodiment, the removal rate selectivity of the first slurry is greater than 50:1 and the removal rate selectivity of the second slurry is 20-1:1. In another example embodiment, the removal rate selectivity of the second slurry is 17-1.5:1.

FIGS. 19-21 illustrates the formation of an aluminum film 18, CMP polishing with a first CMP slurry, which may cause surface defects, and polishing with a second CMP slurry, such as a slurry in accordance with example embodiments of the present invention to remove or reduce the surface defects caused by the first CMP slurry.

Figure 22:
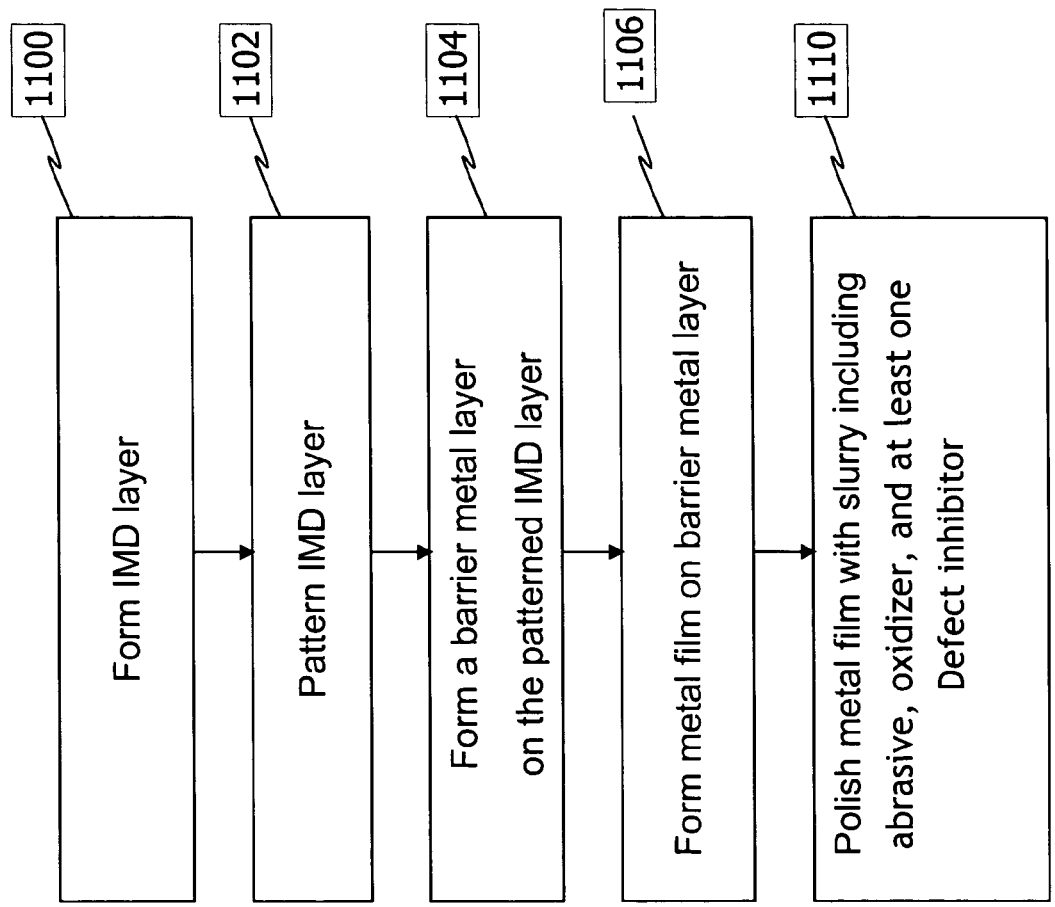
FIG. 22 illustrates an example method of forming metal wiring in accordance with the present invention using a slurry including an abrasive, an oxidizer, and at least one defect inhibitor.

In an example embodiment, a CMP slurry according to the present invention may be used to form metal wiring. As shown in FIG. 22, an example method of forming metal wiring in accordance with the present invention may include forming an IMD layer, such as IMD 12, at 1100, patterning the IMD layer at 1102, forming a barrier metal layer, such as barrier metal layer 16, on the patterned IMD layer at 1104, forming a metal film on barrier metal layer, such as aluminum film 18, at 1106, and polishing the metal film with a slurry including an abrasive, an oxidizer, and at least one defect inhibitor at 1110.

In an example embodiment, the inter metal dielectric layer is one of a silicon oxide layer and a silicon nitride layer. In another example embodiment, the metal film is depositing by sputtering or by chemical vapor deposition (CVD).

In an example embodiment, the removal rate selectivity of the slurry is 20-1:1. In another example embodiment, the removal rate selectivity of the slurry is 17-1.5:1.

Figure 23:
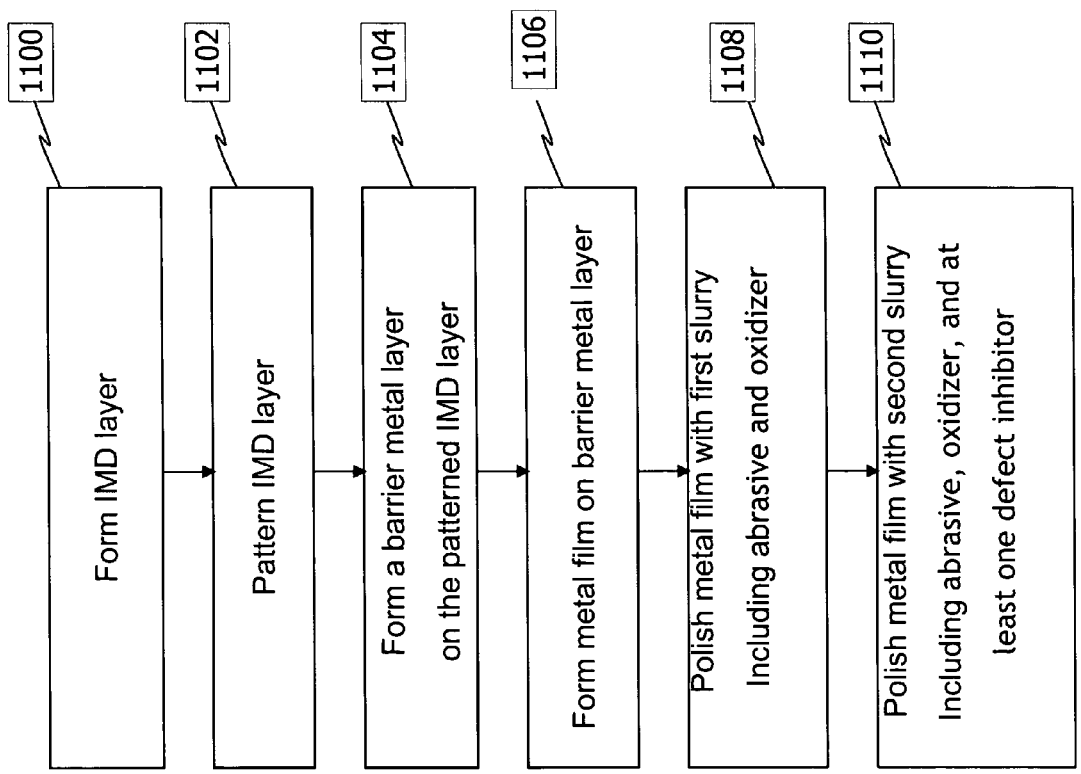
FIG. 23 illustrates another example method of forming metal wiring in accordance with the present invention using a first slurry including an abrasive and an oxidizer and a second slurry including an abrasive, an oxidizer, and at least one defect inhibitor.

In another example embodiment, a CMP slurry according to the present invention may be usually used as a second CMP slurry to polish the surface of a metal layer after a first CMP is performed so that the metal wiring is maintained at the damascene pattern, thus exposing the surface of the inter metal dielectric layer. As shown in FIG. 23, an example method of forming metal wiring in accordance with the present invention may include forming an IMD layer, such as IMD 12, at 1100, patterning the IMD layer at 1102, forming a barrier metal layer, such as barrier metal layer 16, on the patterned IMD layer at 1104, forming a metal film on barrier metal layer, such as aluminum film 18, at 1106, polishing the metal film with a first slurry including an abrasive and an oxidizer at 1108, and polishing the metal film with a second slurry including an abrasive, an oxidizer, and at least one defect inhibitor at 1110.

In an example embodiment, the inter metal dielectric layer is one of a silicon oxide layer and a silicon nitride layer. In another example embodiment, the metal film is depositing by sputtering or by chemical vapor deposition (CVD).

In an example embodiment, the removal rate selectivity of the first slurry is greater than removal rate selectivity of the second slurry. In another example embodiment, the removal rate selectivity of the first slurry is greater than 50:1 and the removal rate selectivity of the second slurry is 20-1:1. In another example embodiment, the removal rate selectivity of the second slurry is 17-1.5:1.

In an example embodiment, the surface of the metal wiring may be refined during the second polishing by removing defects such as scratches, corrosions, and pits, are caused during the first polishing.

Although example embodiments of the present invention set forth above, describe polymeric compounds having a carboxyl group, any compound that can generate anions, which adsorb onto the surface of a metal layer, and/or hydrogen ions, which acidify the CMP slurry solution would be suitable.

Although example embodiments of the present invention set forth above, describe poly acrylic acid (PAA), poly acrylic acid co maleic acid (PAMA), salts thereof, and mixtures thereof, any compound having a carboxyl group that can generate anions, which adsorb onto the surface of a metal layer, and/or hydrogen ions, which acidify the CMP slurry solution would be suitable.

Although example embodiments of the present invention set forth above, describe the abrasive as a silica, such as colloidal silica and/or fumed silica, any abrasive would be suitable.

Although example embodiments of the present invention set forth above, describe the oxidizer as hydrogen peroxide ($H_2O_2$) and/or ammonium persulfate $(NH4)_2S_2O_8$, any oxidizer would be suitable.

Although example embodiments of the present invention set forth above, describe the pH controller as one or more of $H_3PO_4$, $HNO_3$, and $H_2SO_4$, any pH controller would be suitable.

Although example embodiments of the present invention set forth above, describe the chelating agent as ethylene diaminetetraacetic acid (EDTA), nitrilotriacetic acid (NTA), diethylenetriaminepentaacetic acid (DTPA), hydroxyethyl ethylene diaminetriacetic acid (HEDTA), methylglycinediacetic acid (MGDA), salts thereof, and mixtures thereof, any chelating agent would be suitable.

Example embodiments of the present invention may reduce defects, such as scratches, pits, corrosion, erosion, and/or dishing in a variety of areas. These areas may include areas where features are more densely packed and other areas, such as bond pads, with large open features. More specifically, these areas may include areas with isolated thin lines, isolated wide lines, dense thin lines, dense wide lines, or combinations thereof.

It will be apparent to those skilled in the art that other changes and modifications may be made in the above-described example embodiments without departing from the scope of the invention herein, and it is intended that all matter contained in the above description shall be interpreted in an illustrative and not a limiting sense.

We claim:

1. A slurry for a chemical mechanical polishing (CMP) method for a metal film, comprising:
    a polishing agent including at least one material selected from the group consisting of colloidal silica and fumed silica, and the content of the polishing agent is in a range of 0.5-20 weight % (inclusive) of a total weight of the slurry;
    an oxidant; and
    at least one defect inhibitor to protect the metal film, wherein the at least one defect inhibitor includes an ionic group with a charge opposite to a charge on a surface of the metal film.

2. The slurry of claim 1, wherein a first of the at least one defect inhibitors forms a protective layer on the metal film.

3. The slurry of claim 1, wherein a first of the at least one defect inhibitors adsorbs onto a surface of the metal film.

4. The slurry of claim 1, wherein a first of the at least one defect inhibitors includes a polymeric compound further including a carboxyl group.

5. The slurry of claim 4, wherein the first of the at least one defect inhibitors includes a co-polymer further including acrylic acid.

6. The slurry of claim 5, wherein a content of the first of the at least one defect inhibitors is in a range of 0.01-20 weight % (inclusive) of a total weight of the slurry.

7. The slurry of claim 4, wherein the first of the at least one defect inhibitors includes at least one material selected from the group consisting of PAA, PAMA, salts thereof, and mixtures thereof.

8. The slurry of claim 7, further comprising a chelating agent.

9. The slurry of claim 8, wherein a content of the chelating agent is in a range of 0.01-20 weight % (inclusive) of a total weight of the slurry.

10. The slurry of claim 8, wherein the chelating agent includes at least one material selected from the group consisting of EDTA, NTA, DTPA, HEDTA, MGDA, salts thereof, and mixtures thereof.

11. The slurry of claim 1, wherein a content of the oxidant is in a range of 0.5-5 weight % (inclusive) of a total weight of the slurry.

12. The slurry of claim 1, wherein the metal film is an aluminum or aluminum alloy film.

13. The slurry of claim 1, wherein the metal film forms a wiring or a plug.

14. A slurry for a chemical mechanical polishing (CMP) method for a metal film, comprising:
    a polishing agent;
    an oxidant including at least one material selected from the group consisting of hydrogen peroxide and ammonium persulfate, and the content of the oxidant is in a range of 0.5-5 weight % (inclusive) of a total weight of the slurry; and
    at least one defect inhibitor to protect the metal film, wherein the at least one defect inhibitor includes an ionic group with a charge opposite to a charge on a surface of the metal film.

15. A slurry for a chemical mechanical polishing (CMP) method for a metal film, comprising:
    a polishing agent;

an oxidant;

at least one defect inhibitor to protect the metal film, wherein the first of the at least one defect inhibitors includes at least one material selected from the group consisting of PAA, PAMA, salts thereof, and mixtures thereof, wherein the at least one defect inhibitor includes an ionic group with a charge opposite to a charge on a surface of the metal film; and a pH controller for controlling a pH of the slurry.

16. The slurry of claim 15, wherein the pH controller includes at least one material selected from the group consisting of $H_3PO_4$, $HNO_3$, and $H_2SO_4$.

17. The slurry of claim 15, wherein the pH controller lowers the pH of the slurry and raises a zeta potential of the metal film between the metal film and the slurry.

18. A slurry for a chemical mechanical polishing (CMP) method for a metal film, comprising:

a polishing agent;

an oxidant; and at least one defect inhibitor to protect the metal film, wherein the first of the at least one defect inhibitors includes at least one material selected from the group consisting of PAA, PAMA, salts thereof, and mixtures thereof, and further lowers a pH of the slurry, and wherein the at least one defect inhibitor includes an ionic group with a charge opposite to a charge on a surface of the metal film.

19. The slurry of claim 18, wherein the first of the at least one defect inhibitors further includes H+ ions.

* * * * *